(12) United States Patent
Pfeuffer

(10) Patent No.: US 9,461,211 B2
(45) Date of Patent: Oct. 4, 2016

(54) METHOD FOR PRODUCING A CONNECTION REGION OF AN OPTOELECTRONIC SEMICONDUCTOR CHIP

(71) Applicant: OSRAM Opto Semiconductors GmbH, Regensburg (DE)

(72) Inventor: Alexander Pfeuffer, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/646,704

(22) PCT Filed: Oct. 28, 2013

(86) PCT No.: PCT/EP2013/072507
§ 371 (c)(1),
(2) Date: May 21, 2015

(87) PCT Pub. No.: WO2014/079657
PCT Pub. Date: May 30, 2014

(65) Prior Publication Data
US 2015/0295137 A1   Oct. 15, 2015

(30) Foreign Application Priority Data
Nov. 21, 2012 (DE) .......................... 10 2012 111 245

(51) Int. Cl.
*H01L 21/00* (2006.01)
*H01L 33/40* (2010.01)
(Continued)

(52) U.S. Cl.
CPC .............. *H01L 33/40* (2013.01); *H01L 33/14* (2013.01); *H01L 33/382* (2013.01); *H01L 33/46* (2013.01); *H01L 2924/0002* (2013.01); *H01L 2933/0016* (2013.01); *H01L 2933/0025* (2013.01)

(58) Field of Classification Search
CPC ..... H01L 33/40; H01L 33/14; H01L 33/382; H01L 33/46; H01L 2924/0002; H01L 2933/0016; H01L 2933/0025
USPC .............................................................. 438/29
See application file for complete search history.

(56) References Cited

U.S. PATENT DOCUMENTS 7,956,376 B2 *   6/2011   Jeong .................... H01L 33/42
                                                              257/79
8,039,279 B2 *  10/2011   Chuang ................. H01L 33/40
                                                              438/28

(Continued)

FOREIGN PATENT DOCUMENTS

DE   10 2007 022 947 A1   10/2008
DE      102008035254 A1    2/2010

(Continued)

Primary Examiner — Tod T Van Roy
Assistant Examiner — Vu A Vu
(74) Attorney, Agent, or Firm — McDermott Will & Emery LLP

(57) ABSTRACT

The invention relates to a method for producing a connection region (70) of an optoelectronic semiconductor chip (100), comprising the following steps: providing an optoelectronic semiconductor chip (100), forming or exposing a seed layer (6) on an outer surface (100*a*) of the optoelectronic semiconductor chip (100), and depositing a contact layer sequence (7) on the seed layer (6) without current, wherein the seed layer (6) is formed comprising a metal that enables nickel to be deposited on the seed layer (6) without current, the contact layer sequence (7) comprises a nickel layer (71) as a first layer facing the seed layer (6), and the contact layer sequence (7) has a contact surface (7*a*) on the side of the contact layer sequence facing away from the seed layer (6), by means of which contact surface the optoelectronic semiconductor chip (100) can be electrically contacted.

21 Claims, 3 Drawing Sheets

Figure 1:
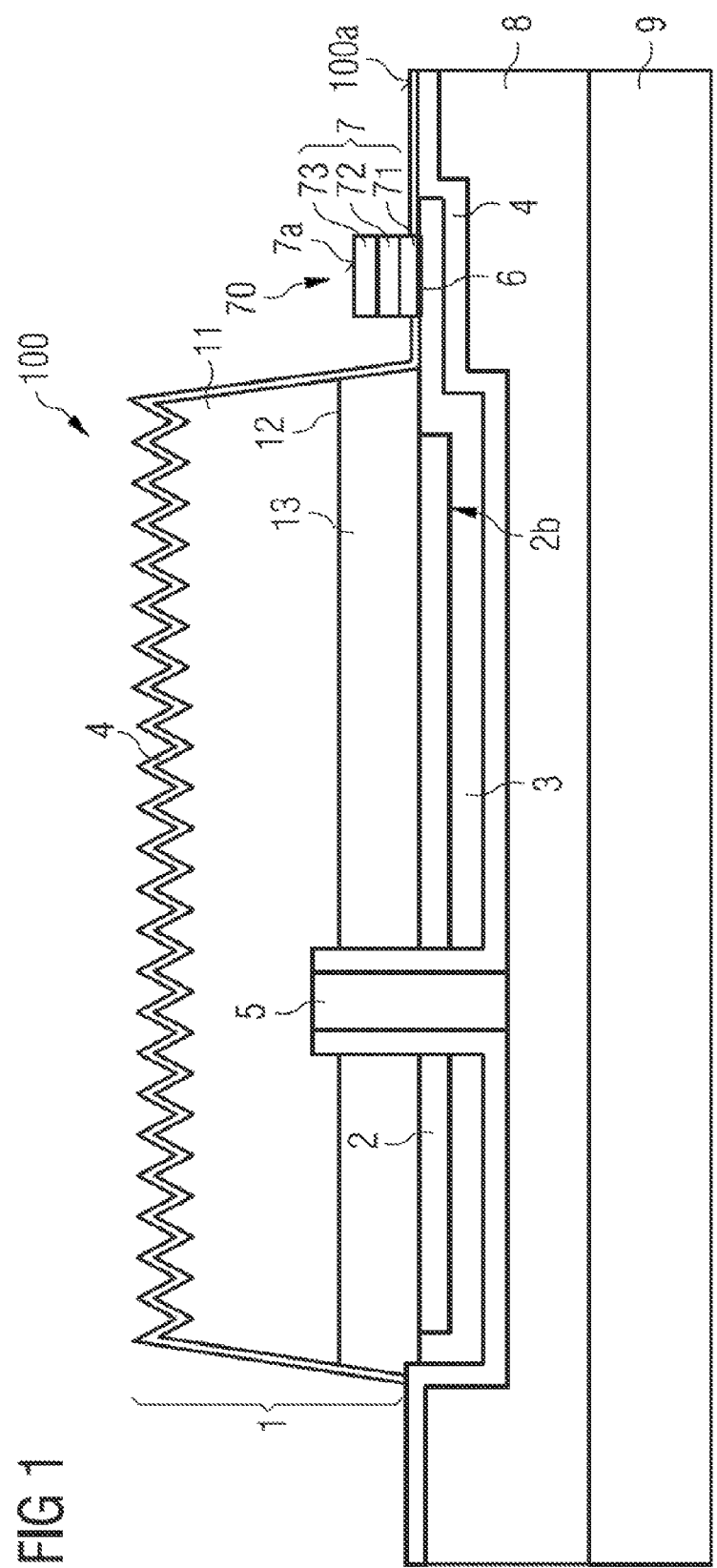

(51) Int. Cl.
*H01L 33/38* (2010.01)
*H01L 33/14* (2010.01)
*H01L 33/46* (2010.01)

(56) References Cited

U.S. PATENT DOCUMENTS

| | | |
|---|---|---|
| 2008/0032434 A1 | 2/2008 | Chuang et al. |
| 2010/0171135 A1 | 7/2010 | Engl et al. |
| 2011/0200842 A1* | 8/2011 | Uhlig .................. C23C 18/1601 428/652 |
| 2012/0313138 A1* | 12/2012 | Peter .................... H01L 33/007 257/101 |

FOREIGN PATENT DOCUMENTS

| | | |
|---|---|---|
| DE | 102009010480 A1 | 9/2010 |
| DE | 102010009717 A1 | 9/2011 |
| DE | 10 2010 045 390 A1 | 3/2012 |
| EP | 2402995 A2 | 1/2012 |
| EP | 2472602 A2 | 7/2012 |
| WO | 2010/012267 A1 | 2/2010 |

* cited by examiner

METHOD FOR PRODUCING A CONNECTION REGION OF AN OPTOELECTRONIC SEMICONDUCTOR CHIP

A method for producing a connection region of an optoelectronic semiconductor chip is specified. The document WO 2010/012267 A1 describes a method for producing a connection region of an optoelectronic semiconductor chip.

One object to be achieved is to specify a method by which a connection region of an optoelectronic semiconductor chip can be produced which is distinguished by a particularly good corrosion resistance.

In accordance with at least one embodiment of the method for producing a connection region of an optoelectronic semiconductor chip, firstly an optoelectronic semiconductor chip is provided. In this case, the optoelectronic semiconductor chip is present in the wafer assemblage, for example. That is to say that a multiplicity of optoelectronic semiconductor chips can be provided, wherein in each case at least one connection region is provided for each semiconductor chip of the wafer assemblage by means of the method.

The optoelectronic semiconductor chip is a light emitting diode chip, for example. The optoelectronic semiconductor chip can be designed to generate electromagnetic radiation from the spectral range from UV radiation to infrared radiation during operation. For this purpose, the optoelectronic semiconductor chip comprises a semiconductor body based for example on a III-V compound semiconductor material.

A III-V compound semiconductor material comprises at least one element from the third main group, such as B, Al, Ga, In, for example, and an element from the fifth main group, such as N, P, As, for example. In particular, the term "III-V compound semiconductor material" encompasses the group of binary, ternary or quaternary compounds which contain at least one element from the third main group and at least one element from the fifth main group, for example nitride and phosphide compound semiconductors. Such a binary, ternary or quaternary compound can additionally comprise for example one or a plurality of dopants and additional constituents.

In particular, the semiconductor body can be based on a nitride compound semiconductor material. In the present context, "based on nitride compound semiconductor material", means that the semiconductor body or at least one part thereof, particularly preferably at least one active zone and/or a growth substrate wafer, comprises or consists of a nitride compound semiconductor material, preferably $Al_nGa_mIn_{1-n-m}N$, wherein $0 \leq n \leq 1$, $0 \leq m \leq 1$ and $n+m \leq 1$. In this case, this material need not necessarily have a mathematically exact composition according to the above formula. Rather, it can comprise for example one or a plurality of dopants and additional constituents. For the sake of simplicity, however, the above formula includes only the essential constituents of the crystal lattice (Al, Ga, In, N), even if these can be replaced and/or supplemented in part by small amounts of further substances.

In accordance with at least one embodiment of the method, a seed layer is formed or exposed at an outer surface of the optoelectronic semiconductor chip. That is to say that a seed layer is fitted or exposed in a specific, delimited region of the outer surface of the optoelectronic semiconductor chip.

If the seed layer is formed at the outer surface of the optoelectronic semiconductor chip, then for example material that forms the seed layer is applied to the optoelectronic semiconductor chip at the outer surface thereof.

If the seed layer is exposed at an outer surface of the optoelectronic semiconductor chip, then the seed layer is already present in the optoelectronic semiconductor chip and the seed layer is exposed by removal of material above the seed layer, such that the latter is freely accessible at the outer surface of the optoelectronic semiconductor chip.

In both cases, that is to say in the case of forming and in the case of exposing the seed layer, the seed layer is freely accessible at the outer surface of the optoelectronic semiconductor chip after the forming or exposing. The seed layer then serves as a start layer for forming the connection region at the seed layer.

In accordance with at least one embodiment of the method for producing a connection region of an optoelectronic semiconductor chip, forming or exposing the seed layer is followed by electroless deposition of a contact layer sequence on the seed layer. The contact layer sequence comprises at least two layers formed with mutually different materials, in particular with mutually different metals. The contact layer sequence is deposited at least partly in an electroless fashion. That is to say that at least one layer of the contact layer sequence, in particular all layers of the contact layer sequence, are applied to the seed layer by electroless deposition. The deposition of the contact layer sequence is carried out in an electroless fashion, that is to say without an external current being applied. In this case, reducing agents and oxidizing agents are present in a solution, such that the deposition is carried out by means of a redox reaction of differently noble metals.

In accordance with at least one embodiment of the method, the seed layer is formed with a metal which enables the electroless deposition of nickel on the seed layer. That is to say that the seed layer enables in particular an autocatalytic deposition of nickel. In this case, the seed layer offers good starting properties for the autocatalytic deposition of nickel.

In accordance with at least one embodiment of the method, the contact layer sequence comprises a nickel layer as first layer facing the seed layer. That is to say that the contact layer sequence comprises at least one nickel layer, the nickel layer directly adjoins the seed layer and is applied to the seed layer by means of an autocatalytic deposition method, for example.

In accordance with at least one embodiment of the method, the contact layer sequence has a contact area at its side facing away from the seed layer, via which contact area the optoelectronic semiconductor chip is electrically contactable. That is to say that the contact layer sequence is terminated by a contact area at its side facing away from the seed layer, at which contact area an electrical contact with the semiconductor chip can be produced. Via the contact area, electric current can be impressed through the contact layer sequence into the optoelectronic semiconductor chip and excite there for example the generation of electromagnetic radiation.

The connection region of the optoelectronic semiconductor chip is formed by the seed layer, the contact layer sequence and the contact area terminating the contact layer sequence. In this case, the contact area is formed by an outer surface of the outermost layer of the contact layer sequence that is situated facing away from the seed layer.

In accordance with at least one embodiment of the method for producing a connection region of an optoelectronic semiconductor chip, the method comprises the following steps:

providing an optoelectronic semiconductor chip, forming or exposing a seed layer at an outer surface of the optoelectronic semiconductor chip, and electroless deposition of a contact layer sequence on the seed layer, wherein the seed layer is formed with a metal which enables the electroless deposition of nickel on the seed layer the contact layer sequence comprises a nickel layer as first layer facing the seed layer, and the contact layer sequence has a contact area at its side facing away from the seed layer, via which contact area the optoelectronic semiconductor chip is electrically contactable.

In this case, the method described here is based on the following considerations, inter alia: for the electrical contacting of optoelectronic semiconductor chips, it proves to be advantageous to use metallic contact areas. On a radiation emission side of the optoelectronic semiconductor chip, for example, for this purpose connection regions (referred to as pads) are formed which are greatly delimited locally, since the emission area of the semiconductor chip is intended to be as large as possible in comparison with the connection area in order that as much electromagnetic radiation as possible can leave the optoelectronic semiconductor chip. High demands are placed on these connection regions with regard to their adhesion to the optoelectronic semiconductor chip, their ageing stability, their connectability and also their contact resistance. On account of the advantageous high ageing stability, noble metals such as gold or platinum are particularly preferably used for forming the connection regions. However, these expensive materials can often be utilized only partly, since the connection region firstly is formed over a large area, for example by sputtering or vapor deposition, and is subsequently removed again at least in part by means of a patterning step. This gives rise to high costs.

The method described here makes it possible to form the connection region by electroless deposition in a targeted manner at the optoelectronic semiconductor chip only where it remains in the completed optoelectronic semiconductor chip. As a result, it is possible to reduce the material costs.

In the case of the method described here, an electroless deposition method is used for forming the connection region. A connection region produced by this method is distinguished by its good corrosion resistance. Furthermore, a connection region produced by the electroless deposition method is distinguished by a high layer conformity of the layers of the contact layer sequence and a high layer quality of said layers. In the electroless deposition method, the reducing agents and the oxidizing agents are present in solution in the coating bath.

In the case of the method described here, a seed layer is used which enables the electroless deposition of nickel.

With the method described here, the connection region can be applied directly to the semiconductor body. Furthermore, it is possible for the connection region to be arranged in a manner laterally spaced apart from the semiconductor body.

In accordance with at least one embodiment of the method, the seed layer is formed with one of the following metals or consists of one of the following metals: nickel, rhodium, palladium, cobalt, iron, gold. Nickel and palladium, in particular, are particularly well suited here to enabling the electroless deposition of a nickel layer on the seed layer.

In accordance with at least one embodiment of the method, the contact layer sequence is formed by the following succession of metals or consists of the following succession of metals: nickel, palladium, gold. That is to say that the contact layer sequence comprises for example a nickel layer, a palladium layer and a gold layer. In this case, the nickel layer is that layer which directly succeeds the seed layer and which directly adjoins the seed layer. The palladium layer can be applied directly to the nickel layer and directly adjoin the nickel layer at that side of the nickel layer which faces away from the seed layer. The gold layer in turn can be applied directly to the palladium layer and directly adjoin the palladium layer at that side of the palladium layer which faces away from the nickel layer. The outer surface of the gold layer facing away from the palladium layer then forms the contact area of the connection region.

In accordance with at least one embodiment of the method, the contact area is embodied as wire-contactable. That is to say that the contact area can be contacted by means of a wire contacting process, that is to say by wire bonding, for example. In this case, the wire can be formed with gold or aluminum. A contact area formed by the outer surface of a gold layer is particularly well suited to wire contacting. Furthermore, it is possible for the contact area also to be suitable for contacting by soldering and adhesive bonding. A contact area formed by the outer surface of a gold layer is particularly well suited to this purpose as well.

In accordance with at least one embodiment of the method, the seed layer is applied to the optoelectronic semiconductor chip by means of one of the following materials at the outer surface of the optoelectronic semiconductor chip: vapor deposition, sputtering, electroless deposition, electrochemical deposition. That is to say that for the case where the seed layer is formed at the outer surface of the optoelectronic semiconductor chip, in other words the seed layer is not exposed, one of the production methods mentioned, for example, is used for forming the seed layer.

In accordance with at least one embodiment of the method, before the seed layer is applied, a passivation layer at the outer surface of the optoelectronic semiconductor chip is removed in places using a mask layer and the seed layer is deposited using the same mask layer. The mask layer is applied to the passivation layer, for example. A window can be produced in the mask layer by means of a lithographic method, for example, through which window the passivation layer situated below the mask layer is selectively removed in the region of the window. A layer of the optoelectronic semiconductor chip is then exposed, via which layer the optoelectronic semiconductor chip can be electrically contacted. At this exposed outer surface of the optoelectronic semiconductor chip, using the same mask that was used to produce the passivation layer, the seed layer can then be deposited for example in the window of the mask layer. This deposition can then be carried out by means of vapor deposition, sputtering, electroless deposition or electrochemical deposition.

In addition, it is possible that the subsequent layers of the contact layer sequence, which can be applied by electroless deposition, are also applied using the mask layer already present. The mask layer can finally be removed or remain as additional passivation material in the optoelectronic semiconductor chip.

In accordance with at least one embodiment of the method, the seed layer is present in the optoelectronic semiconductor chip and the seed layer is exposed by material that is arranged above the seed layer being removed in places. By way of example, above the seed layer an electrically insulating passivation layer is present at the outer surface of the optoelectronic semiconductor chip. Once again with the aid of a mask technique in which the mask layer is patterned lithographically, for example, the passivation layer is selectively removed, such that the seed layer is exposed for the electroless deposition of the contacting layer sequence. However, the seed layer can also be exposed by alternative methods such as, for example, by laser ablation without the use of a mask layer.

In the case of a seed layer that is already present in the optoelectronic semiconductor chip, it is possible that the seed layer extends below a semiconductor body of the optoelectronic semiconductor chip, wherein the semiconductor body comprises an active region. Electromagnetic radiation is generated in the active region during operation of the optoelectronic semiconductor chip, for example. The seed layer is integrated into the layer stack of the optoelectronic semiconductor chip and can extend below the semiconductor body, for example at an underside of a mirror layer facing away from the semiconductor body. A seed layer integrated into the optoelectronic semiconductor chip in this way can realize there, besides its function as a seed layer for forming the contact layer sequence, further functions such as, for example, the function of an adhesion promoting layer, a diffusion barrier or a current conducting layer. In this way, the seed layer can be utilized for at least two functions in the optoelectronic semiconductor chip.

In particular, it is possible for the seed layer to be an electrically conductive layer which can be part of a current spreading layer of the optoelectronic semiconductor chip. The seed layer is preferably resistant to methods by which the semiconductor body of the optoelectronic semiconductor chip is patterned. By way of example, mesa etching using hot acid at a temperature of greater than 100° C. is carried out for patterning the semiconductor body of the optoelectronic semiconductor chip. In particular, phosphoric acid at a temperature of greater than 160° C., for example 170° C., can be used. In this case, the seed layer is resistant to this patterning method. In particular a seed layer formed with palladium has this etching resistance. Such a seed layer makes it possible for the semiconductor body to be patterned completely wet-chemically.

In accordance with at least one embodiment of the method, the optoelectronic semiconductor chip comprises a current spreading layer extending below the semiconductor body. By way of example, the current spreading layer, electrically connected to a p-conducting semiconductor region, runs below the p-conducting semiconductor region of the semiconductor body.

In this case, the current spreading layer is preferably electrically conductively connected to the seed layer and thus to the connection region produced by the method described here, such that a contacting of the optoelectronic semiconductor chip can be effected by means of a contacting of the optoelectronic semiconductor chip at the connection region via the current spreading layer.

In this case, it is possible, in particular, for the seed layer to be part of a layer stack of the current spreading layer. In this case, the current spreading layer is then formed from at least two layers, of which the seed layer is formed at that side of the current spreading layer which faces the semiconductor body.

In accordance with at least one embodiment of the method the seed layer is covered by a barrier layer at its side facing the semiconductor body. In this case, the seed layer is not formed at an outer surface of the current spreading layer, rather it forms one of the inner layers of the current spreading layer. In this case, the barrier layer can prevent undesirable diffusion processes between the mirror layer and the current spreading layer. That is to say that the barrier layer performs the function of a diffusion barrier between the mirror layer and at least parts of the current spreading layer. The mirror layer can then be formed for example with a material that tends toward migration, such as silver. That is to say that the layer succession below the semiconductor body of the optoelectronic semiconductor chip, as viewed from the semiconductor body, can then be as follows: semiconductor body, mirror layer, barrier layer, seed layer, further layers of the current spreading layer.

In accordance with at least one embodiment of the method, the current spreading layer is exposed at the outer surface of the optoelectronic semiconductor chip and the seed layer is applied to the exposed region of the current spreading layer. By way of example, the exposed region of the current spreading layer can then be formed by the barrier layer. In this case, the seed layer does not run below the semiconductor body, but rather is merely produced selectively from outside. In this case, the seed layer can be applied for example to the barrier layer arranged between the mirror layer and the remaining layers of the current spreading layer.

In accordance with at least one embodiment of the method, the optoelectronic semiconductor chip comprises a plated-through hole extending through the active region of the semiconductor body, and a connecting medium is electrically conductively connected to a semiconductor region of the semiconductor body.

The plated-through hole then extends through the current spreading layer, the mirror layer, the p-conducting region and the active region of the semiconductor body into the n-conducting region of the semiconductor body. The connecting medium, which is formed with a solder material, for example, is electrically conductively connected to the n-conducting semiconductor region via the plated-through hole and serves for energizing the semiconductor body from its n-conducting side.

In accordance with at least one embodiment of the method, the seed layer is part of the layer stack of the current spreading layer of the optoelectronic semiconductor chip. The current spreading layer and thus also the seed layer extend below the semiconductor body of the optoelectronic semiconductor chip and can be exposed laterally with respect to the semiconductor body, for example. By way of example, the current spreading layer extends over at least 90% of the cross-sectional area or over the entire cross-sectional area of the semiconductor chip. In this case, the current spreading layer can comprise a barrier layer facing the semiconductor body, the seed layer, a current carrying layer and an adhesion promoting layer. The adhesion promoting layer then faces away from the semiconductor body of the semiconductor chip in places. The barrier layer applied to the seed layer is distinguished by a good adhesion to dielectric layers and can be wet-chemically etched selectively for example with respect to the metal with which the seed layer is formed.

Before the connection region is produced, the seed layer is exposed, wherein the barrier layer can be removed. If the barrier layer is formed with a metal that tends toward oxidation, for example, then the barrier layer is preferably opened a short time before the deposition of the contact layer sequence. In this way, the barrier layer can enable the use of less expensive metals that tend toward oxidation for the seed layer. By way of example, nickel instead of expensive palladium can then be used for the seed layer.

The method described here is explained in greater detail below on the basis of exemplary embodiments and the associated figures.

Figure 2:
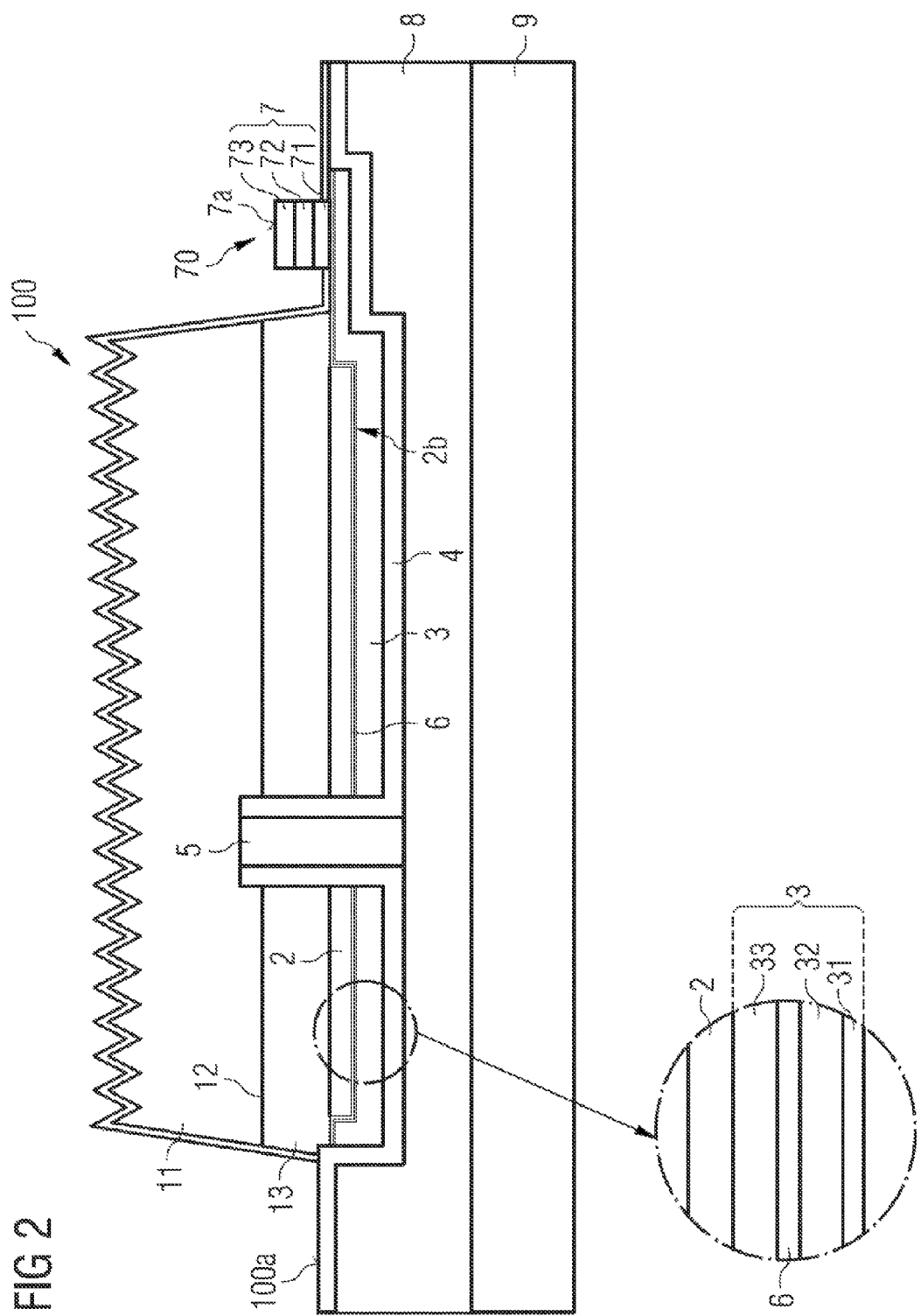
Figure 3:
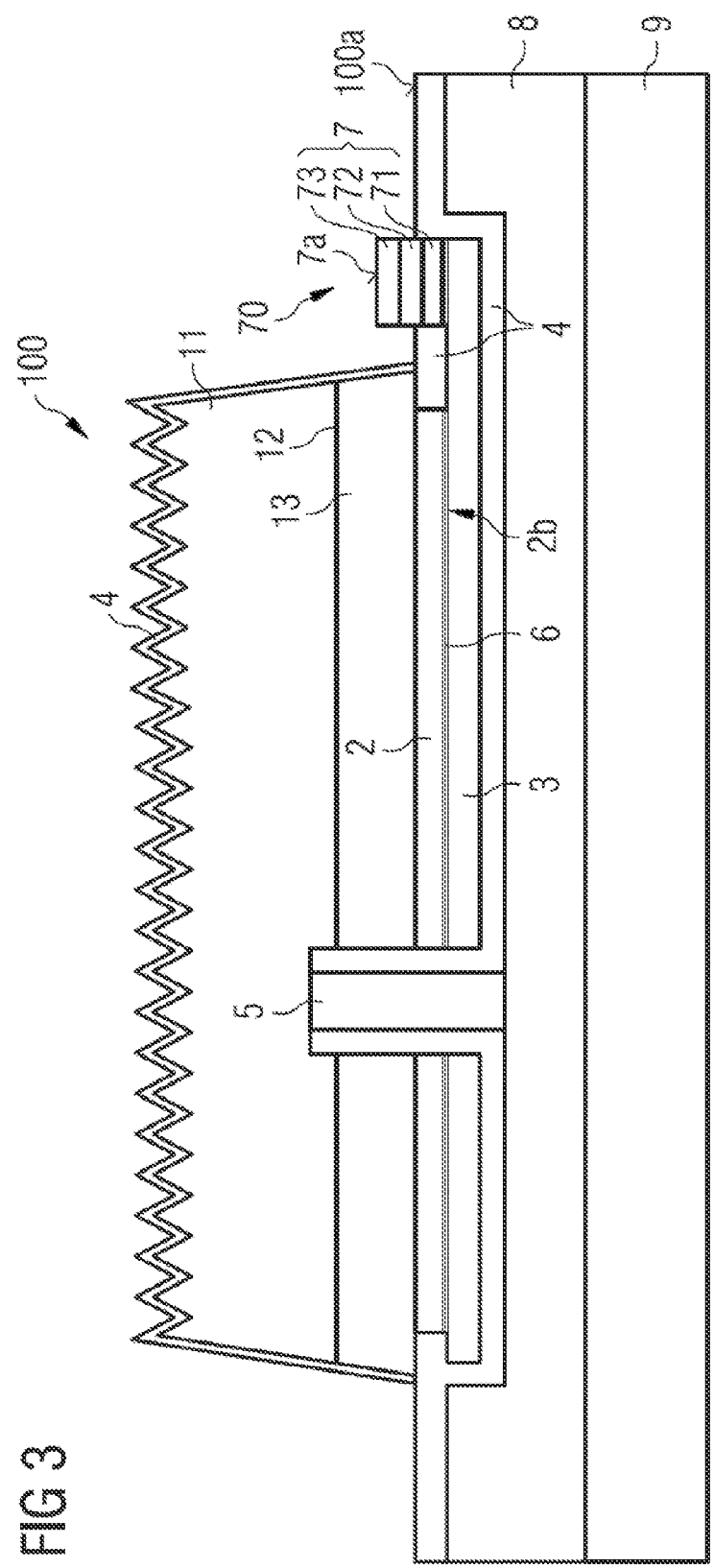

FIGS. 1, 2 and 3 show optoelectronic semiconductor chips produced by means of a method described here in schematic sectional illustrations.

Elements that are identical, of identical type or act identically are provided with the same reference signs in the figures. The figures and the size relationships of the elements illustrated in the figures among one another should not be regarded as true to scale. Rather, individual elements may be illustrated with an exaggerated size in order to enable better illustration and/or in order to afford a better understanding.

FIG. 1 shows an optoelectronic semiconductor chip 100, at the outer surface 100a of which a connection region 70 is situated, which connection region is produced by a method described here. The optoelectronic semiconductor chip 100 is a light emitting diode chip, for example. The semiconductor chip 100 comprises a semiconductor body 1. The semiconductor body 1 is based on a nitride-based compound semiconductor material, for example.

The semiconductor body 1 comprises an n-conducting semiconductor region 11, an active region 12 and a p-conducting semiconductor region 13. Electromagnetic radiation for example from the spectral range of visible light is generated in the active region 12 during the operation of the semiconductor chip 100.

The optoelectronic semiconductor chip furthermore comprises a mirror layer 2. The mirror layer 2 is formed with a highly conductive and reflective metal such as silver, for example. The mirror layer 2 is in electrically conductive contact with the p-conducting semiconductor region 13.

The semiconductor chip 100 furthermore comprises a current spreading layer 3. The current spreading layer 3 is arranged at the underside of the mirror layer 2 facing away from the semiconductor body 1 and extends in a lateral direction in a region in which the semiconductor body 1 is removed by a mesa etch, for example. In this case, the lateral direction is a direction that runs perpendicularly to the growth direction of the semiconductor body.

The semiconductor chip 100 furthermore comprises a passivation layer 4, which electrically insulates the current spreading layer 3 from a connecting medium 8, which can be a solder material, for example. The connecting medium 8 is electrically conductively connected to the n-conducting semiconductor region 11 via a plated-through hole 5, which can be formed with the same material as the connecting medium 8. In this case, the plated-through hole 5 is electrically insulated from the current spreading layer 3, the mirror layer 2, the p-conducting semiconductor region 13 and the active region 12 laterally by the passivation layer 4. The plated-through hole 5 extends through the active region 12 as far as the n-conducting semiconductor region.

The semiconductor chip 100 furthermore comprises a carrier 9, which is connected to the remaining components of the semiconductor chip via the connecting medium 8. The semiconductor chip 100 can be contacted on the n-side for example via the carrier 9, which is embodied in an electrically conductive fashion in this case.

An electrically insulating passivation layer 4 also extends along the flanks and the top side of the semiconductor body 1 facing away from the carrier 9, said top side having a roughening in the present case.

In an edge region of the semiconductor chip laterally at a distance from the semiconductor body 100, the passivation layer 4 is removed in places. By way of example, the passivation layer 4, which is formed with a dielectric material such as SiN or $SiO_2$, for example, can be opened by means of a mask layer (not illustrated). In the opening, the current spreading layer 3 is exposed at the outer surface 100a. A seed layer 6 is deposited onto the current spreading layer 3 by sputtering, for example. The seed layer 6 is formed with palladium, for example, and has a thickness of at least 20 nm and at most 100 nm. The contact layer sequence 7, which in the present case comprises a nitride layer 71, a palladium layer 72 and a gold layer 73, is applied to the seed layer 6 by electroless deposition. At that side of the contact layer sequence 7 which faces away from the seed layer 6, the contact layer sequence 7 has the contact area 7a formed by an outer surface of the gold layer 73. The contact area 7a is suitable for the wire contacting of the optoelectronic semiconductor chip.

The seed layer 6 and the contact layer sequence 7 having the contact area 7a form the connection region 70 which is produced by means of a method described here.

The optoelectronic semiconductor chip 100 is produced by means of two separate lithographic masks for patterning the mirror layer 2 and the current spreading layer 3. The seed layer 6 is deposited after the opening of the dielectric passivation layer 4 and consists of a thin palladium layer in the present case.

In contrast to the exemplary embodiment in FIG. 1, FIG. 2 shows an optoelectronic semiconductor chip 100 in which the connection region 70 is produced by means of a method described here, wherein the seed layer 6 is already situated in the semiconductor chip 100 and is exposed before the contact layer sequence 7 is applied. The optoelectronic semiconductor chip 100 in FIG. 2 is also produced by means of two separate lithographic masks for patterning the mirror layer 2 and the current spreading layer 3. The seed layer 6 is part of the current spreading layer. By way of example, the current spreading layer comprises an adhesion promoting layer 31, which adjoins the passivation layer 4 and imparts an adhesion to the passivation layer 4. The adhesion promoting layer 31 can be formed for example with one of the following materials: titanium, chromium, aluminum, ZnO, ITO or other TCO (transparent conductive oxide) materials.

The current spreading layer 3 furthermore comprises the current carrying layer 32, via which the actual current conduction takes place in the current spreading layer 3. The current carrying layer 32 can be formed for example with one of the following materials: gold, aluminum, copper.

The current carrying layer 32 is succeeded by the seed layer 6, which can be formed for example with palladium, nickel, iron, rhodium, cobalt or gold.

The barrier layer 33 is applied to the seed layer 6, said barrier layer being formed with TiWN, for example. Such a barrier layer 33 has a good adhesion to dielectric layers and can be wet-chemically etched selectively with respect to palladium, for example. Moreover, a barrier layer comprising TiWN is resistant to hot phosphoric acid, and so it is not attacked during a mesa etch for patterning the semiconductor body 1. The barrier layer 33 forms a diffusion barrier between the mirror layer 2 and the remaining layers of the current spreading layer 3.

If nickel instead of palladium is used for forming the seed layer 6, then the formation of a nickel oxide layer, which would prevent an autocatalytic nickel deposition process, can be sufficiently suppressed by near simultaneous opening of the barrier layer 33 above the seed layer and starting of the electroless deposition process. This makes it possible to use less expensive nickel instead of relatively expensive palladium for the seed layer 6.

One exemplary layer sequence for the current spreading layer 3 is TiWN as barrier layer 33, palladium or nickel as seed layer 6, gold for forming the current carrying layer 32 and titanium for forming the adhesion promoting layer 31.

The layer stack for forming the current spreading layer 3, as described in association with FIG. 2, can also be used in the exemplary embodiment in FIG. 1, wherein the seed layer 6 in that case is not arranged in the layer stack of the current spreading layer 3 and the barrier layer 33 directly succeeds the current carrying layer 32 at its side facing away from the adhesion promoting layer 31. In this case, the barrier layer can be palladium-activated by means of a suitable chemical process.

A further exemplary embodiment of an optoelectronic semiconductor chip described here is explained in greater detail in association with FIG. 3. In contrast to the exemplary embodiment in FIG. 2, the mirror layer 2 and the current spreading layer 3 in this exemplary embodiment are patterned jointly by means of a single lithographic mask. The mirror layer 2, which is formed with corrosion-susceptible silver, for example, is drawn behind the mesa edge, that is to say the lateral boundary surface of the semiconductor body 1, only afterward for example by means of a wet-chemical etching. The lateral encapsulation of the silver mirror is effected with the passivation layer 4 from the n-conducting semiconductor region 11 of the semiconductor chip 100. The current spreading layer 3 with the seed layer 6 can be embodied as described in association with FIG. 2.

In order to form the connection region 70, the passivation layer 4 and also the barrier layer 33 are removed above the seed layer 6. In this case, a barrier layer 33 formed with TiWN proves to be particularly advantageous since it can be wet-chemically etched selectively with respect to a seed layer 6 formed with palladium, for example.

A method for producing a connection region 70 as described here can, of course, also be used for other optoelectronic semiconductor chips in which the connection region 70 is applied for example directly on the semiconductor body 1.

This patent application claims the priority of German Patent Application 102012111245.2, the disclosure content of which is hereby incorporated by reference.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for producing a connection region of an optoelectronic semiconductor chip comprising the following steps:
   providing an optoelectronic semiconductor chip comprising a semiconductor body, said semiconductor body comprising an active region;
   exposing a seed layer at an outer surface of the optoelectronic semiconductor chip; and
   electroless deposition of a contact layer sequence on the seed layer,
   wherein the seed layer is formed with a metal which enables the electroless deposition of nickel on the seed layer,
   wherein the contact layer sequence comprises a nickel layer as first layer facing the seed layer,
   wherein the contact layer sequence has a contact area at its side facing away from the seed layer, via which contact area the optoelectronic semiconductor chip is electrically contactable,
   wherein the exposing of the seed layer comprises a step in which material is removed exclusively from a side of the seed layer which faces the semiconductor body, and
   wherein the electroless deposition of the contact layer sequence comprises a step in which the nickel layer is electroless deposited on a region of the seed layer from which the material has been removed.

2. The method according to claim 1, wherein the seed layer is part of a layer stack of a current spreading layer,
   wherein the current spreading layer extends below the semiconductor body of the optoelectronic semiconductor chip and the current spreading layer comprises a barrier layer, the seed layer, a current carrying layer and an adhesion promoting layer, and
   wherein the barrier layer faces the semiconductor body in places and the adhesion promoting layer faces away from the semiconductor body of the semiconductor chip in places.

3. The method according to claim 1, wherein the seed layer is formed with one of the following metals or consists of one of the following metals: nickel, rhodium, palladium, cobalt, gold, iron.

4. The method according to claim 1, wherein the contact layer sequence is formed by the following succession of metals or consists of the following succession of metals: nickel, palladium, gold.

5. The method according to claim 1, wherein the contact area is wire-contactable.

6. The method according to claim 1, wherein the seed layer is applied to the optoelectronic semiconductor chip by means of one of the following materials at the outer surface of the optoelectronic semiconductor chip: vapor deposition, sputtering, electroless deposition, electrochemical deposition.

7. The method according to claim 6, wherein before the seed layer is applied, a passivation layer at the outer surface of the optoelectronic semiconductor chip is removed in places using a mask layer and the seed layer is deposited using the same mask layer.

8. The method according to claim 1, wherein the seed layer is present in the optoelectronic semiconductor chip and the seed layer is exposed by material that is arranged above the seed layer being removed in places.

9. The method according to claim 8, wherein the seed layer extends below a semiconductor body of the optoelectronic semiconductor chip, and
   wherein the semiconductor body comprises an active region.

10. The method according to claim 9, wherein the seed layer is arranged at an underside of a mirror layer facing away from the semiconductor body.

11. The method according to claim 1, wherein the optoelectronic semiconductor chip comprises a current spreading layer extending below the semiconductor body.

12. The method according to claim 11, wherein the seed layer is part of a layer stack of the current spreading layer.

13. The method according to claim 12, wherein the seed layer is covered by a barrier layer at its side facing the semiconductor body.

14. The method according to claim 1, wherein the optoelectronic semiconductor chip comprises a plated-through hole extending through the active region of the semiconductor body, and a connecting medium is electrically conductively connected to a semiconductor region of the semiconductor body.

15. The method according to claim 1, wherein the current spreading layer is exposed at the outer surface of the optoelectronic semiconductor chip and the seed layer is applied to the exposed region of the current spreading layer.

16. The method according to claim 15, wherein the seed layer is applied to the barrier layer.

17. A method for producing a connection region of an optoelectronic semiconductor chip comprising the following steps in the following order:
providing an optoelectronic semiconductor chip comprising a semiconductor body, said semiconductor body comprising an active region and a seed layer, the seed layer extending below the semiconductor body of the optoelectronic semiconductor chip;
exposing a region of the seed layer at an outer surface of the optoelectronic semiconductor chip by removing of material on a side of the seed layer which faces the semiconductor body; and
electroless deposition of a contact layer sequence on the region of the seed layer,
wherein the seed layer is formed with a metal which enables the electroless deposition of nickel on the seed layer,
wherein the contact layer sequence comprises a nickel layer as first layer facing the seed layer, and
wherein the contact layer sequence has a contact area at its side facing away from the seed layer, via which contact area the optoelectronic semiconductor chip is electrically contactable.

18. The method according to claim 17, wherein the seed layer is arranged at an underside of a mirror layer facing away from the semiconductor body.

19. The method according to claim 17, wherein the seed layer is part of a layer stack of a current spreading layer,
wherein the current spreading layer extends below the semiconductor body of the optoelectronic semiconductor chip and the current spreading layer comprises a barrier layer, the seed layer, a current carrying layer and an adhesion promoting layer, and
wherein the barrier layer faces the semiconductor body in places and the adhesion promoting layer faces away from the semiconductor body of the semiconductor chip in places.

20. The method according to claim 17, wherein the seed layer is formed with one of the following metals or consists of one of the following metals: nickel, rhodium, palladium, cobalt, gold, iron.

21. The method according to claim 17, wherein the contact layer sequence is formed by the following succession of metals or consists of the following succession of metals: nickel, palladium, gold.

* * * * *